(12) United States Patent
Kim et al.

(10) Patent No.: US 7,952,944 B2
(45) Date of Patent: May 31, 2011

(54) SYSTEM FOR PROVIDING ON-DIE TERMINATION OF A CONTROL SIGNAL BUS

(75) Inventors: Kyu-hyoun Kim, Mount Kisco, NY (US); Paul W. Coteus, Yorktown, NY (US)

(73) Assignee: International Business Machines Corporation, Armonk, NY (US)

( * ) Notice: Subject to any disclaimer, the term of this patent is extended or adjusted under 35 U.S.C. 154(b) by 430 days.

(21) Appl. No.: 12/112,391

(22) Filed: Apr. 30, 2008

(65) Prior Publication Data

US 2009/0273960 A1 Nov. 5, 2009

(51) Int. Cl.
*G11C 7/10* (2006.01)

(52) U.S. Cl. .............. 365/189.17; 365/189.18; 365/149; 365/206

(58) Field of Classification Search .............. 365/189.17, 365/189.18, 149
See application file for complete search history.

(56) References Cited

U.S. PATENT DOCUMENTS

| | | | |
|---|---|---|---|
| 6,026,456 A | 2/2000 | Ilkbahar | |
| 6,097,638 A * | 8/2000 | Himeno et al. | 365/185.25 |
| 7,286,436 B2 | 10/2007 | Bhakta et al. | |
| 7,289,386 B2 | 10/2007 | Bhakta et al. | |
| 7,298,668 B2 | 11/2007 | Hoppe et al. | |
| 2006/0071683 A1* | 4/2006 | Best et al. | 326/30 |
| 2008/0192558 A1* | 8/2008 | Yoshida et al. | 365/225.7 |
| 2009/0278565 A1* | 11/2009 | Nguyen et al. | 326/30 |

OTHER PUBLICATIONS

U.S. Appl. No. 11/959,711; Kim, Hyu-Hyoun, et al.; "System for Providing Read Clock Sharing Between Memory Devices"; Filed Dec. 19, 2007. Specification having 32 pages. Formal Drawings having 6 sheets.

* cited by examiner

*Primary Examiner* — Vu A Le
*Assistant Examiner* — Han Yang
(74) *Attorney, Agent, or Firm* — Cantor Colburn LLP; William Kinnaman

(57) ABSTRACT

A system for providing on-die termination (ODT) of a control signal bus. The system includes a memory device that includes a plurality of data bus connectors, one or both of a load signal connector and a reset signal connector, a control bus connector, an ODT, and a mechanism. The ODT is in communication with the control bus connector, and the ODT provides a level of termination resistance to a control bus connected to the control bus connector. The mechanism latches data received via the data bus connectors in response to a signal received via one or both of the load signal connector and the reset signal connector. The data is utilized to set the level of termination resistance provided by the ODT.

16 Claims, 8 Drawing Sheets

| CS# | DQ3 | DQ2 | DQ1 | DQ0 | RODT (ohm) |
|---|---|---|---|---|---|
| L | L | L | L | L | infinite |
| L | L | L | L | H | 200 |
| L | L | L | H | H | 100 |
| L | L | H | H | H | 67 |
| L | H | H | H | H | 50 |
| H | L | L | L | L | infinite |
| H | L | L | L | H | |
| H | L | L | H | H | |
| H | L | H | H | H | |
| H | H | H | H | H | |

FIG. 7

| CS# | DQ3 | DQ2 | DQ1 | DQ0 | Chip ID |
|---|---|---|---|---|---|
| L | L | L | L | L | 0000 |
| L | L | L | L | H | 0001 |
| L | L | L | H | H | 0011 |
| L | L | H | H | H | 0111 |
| L | H | H | H | H | 1111 |
| H | L | L | L | L | no change |
| H | L | L | L | H | |
| H | L | L | H | H | |
| H | L | H | H | H | |
| H | H | H | H | H | |

FIG. 8

SYSTEM FOR PROVIDING ON-DIE TERMINATION OF A CONTROL SIGNAL BUS

BACKGROUND OF THE INVENTION

This invention relates generally to computer memory, and more particularly to providing on-die termination of a control signal bus.

Contemporary high performance computing main memory systems are generally composed of one or more memory devices, which are connected to one or more processors via one or more memory control elements. These memory devices are generally located on a memory card module and connected through a module connector to a mother board.

Overall computer system performance is affected by each of the key elements of the computer structure, including the performance/structure of the processor(s), any memory cache(s), the input/output (I/O) subsystem(s), the efficiency of the memory control function(s), the main memory devices(s), and the type and structure of the memory interconnect interface(s).

Extensive research and development efforts are invested by the industry, on an ongoing basis, to create improved and/or innovative solutions to maximizing overall system performance and density by improving the memory system/subsystem design and/or structure. High-availability systems present further challenges as related to overall system reliability due to customer expectations that new computer systems will markedly surpass existing systems in regard to mean-time-between-failure (MTBF), in addition to offering additional functions, increased performance, increased storage, lower operating costs, etc. Other frequent customer requirements further exacerbate the memory system design challenges, and include such items as ease of upgrade and reduced system environmental impact (such as space, power and cooling).

Current memory modules have terminators for control signals (e.g., command and address signals) on the memory module. Typically, the control signal bus is implemented in a fly-by routing with an external terminator located on the memory module after the last memory device. This takes up space on the memory module and adds to the cost of the memory module. On-die termination (ODT) is difficult to implement for a control signal bus because setting the ODT to on/off and to particular resistance values needs to be performed by executing some commands, and executing these commands requires that proper termination for control signals is already in place. Conventional methods to solve this problem include running the memory device at a very slow frequency during ODT setting and then raising the memory device to the normal frequency. Another solution includes adding an additional serial interface pin (e.g., an ODT signal pin) on each memory device. Both of these solutions require additional overhead and longer initialization time. In addition, neither solution allows different memory devices on a memory module to be programmed differently because the control signal bus is common to all of the memory devices on the memory module.

BRIEF SUMMARY OF THE INVENTION

An exemplary embodiment includes a memory device that includes a plurality of data bus connectors, one or both of a load signal connector and a reset signal connector, a control bus connector, an ODT, and a mechanism. The ODT is in communication with the control bus connector, and the ODT provides a level of termination resistance to a control bus connected to the control bus connector. The mechanism latches data received via the data bus connectors in response to a signal received via one or both of the load signal connector and the reset signal connector. The data is utilized to set the level of termination resistance provided by the ODT.

Another exemplary embodiment includes a memory module including a control bus, a data bus, one or both of a load signal and a reset signal, and a memory device. The memory device includes a plurality of data bus connectors in communication with the data bus, one or both of a load signal connector in communication with the load signal and a reset signal connector in communication with the reset signal, a control bus connector in communication with the control bus, an ODT, and a mechanism. The ODT is in communication with the control bus connector, and the ODT provides a level of termination resistance to the control bus. The mechanism latches data received via the data bus connectors in response to a signal received via one or both of the load signal connector and the reset signal connector. The data is utilized to set the level of termination resistance provided by the ODT.

A further embodiment includes a memory device including a plurality of data bus connectors, one or both of a load signal connector and a reset signal connector, a control bus connector, and a mechanism to latch data received via the data bus connectors in response to a signal received via one or both of the load signal connector and the reset signal connector. The data is utilized to program the memory device.

BRIEF DESCRIPTION OF THE DRAWINGS

Referring now to the drawings wherein like elements are numbered alike in the several FIGURES:

FIG. 7 is a truth table that may be implemented by an exemplary embodiment; and

FIG. 8 is a truth table that may be implemented by an exemplary embodiment.

DETAILED DESCRIPTION OF EXEMPLARY EMBODIMENTS

An exemplary embodiment of the present invention includes a system for providing on-die termination (ODT) of a control signal bus (e.g., an address and command bus). This includes the ability to have different memory devices on a memory module in different ODT states. For example, one memory device on a memory module could have the ODT turned on and the rest of the memory devices on the memory module could have the ODT turned off. In addition, the resistance setting of an ODT on one memory device on the memory module could be set to one value and the resistance setting of an ODT on a second memory device could be set to a second value. Exemplary embodiments provide flexibility in managing the states and resistance levels of a control signal bus in a memory subsystem.

Figure 1:
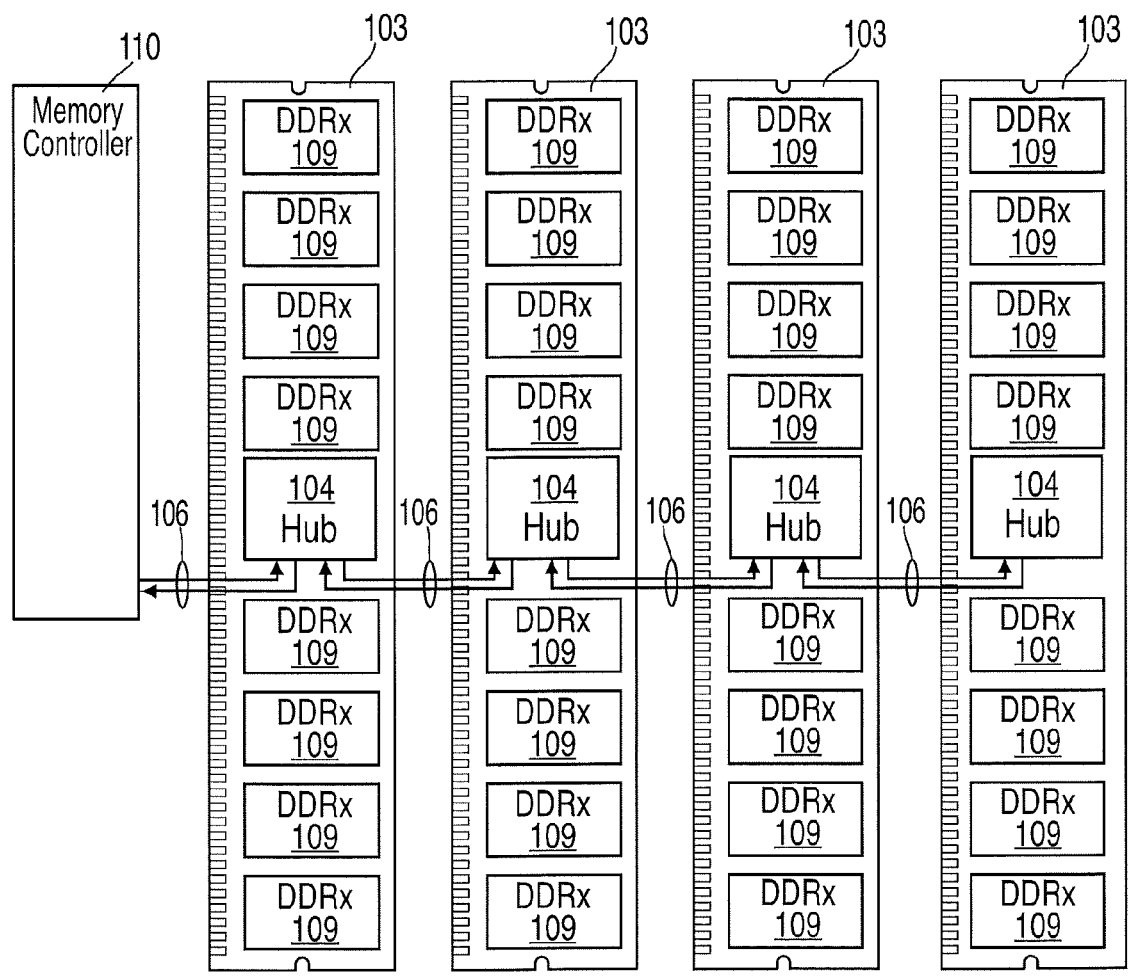
FIG. 1 depicts a cascade interconnect memory system with unidirectional busses that may be implemented by an exemplary embodiments.

FIG. 1 depicts a memory system with cascaded memory modules 103 and unidirectional busses 106 that may be implemented by an exemplary embodiment. One of the functions provided by the hub devices 104 in the memory modules 103 in the cascade structure is a re-drive function to send signals on the unidirectional busses 106 to other memory modules 103 or to the memory controller 110. FIG. 1 includes the memory controller 110 and four memory modules 103, on each of two memory busses 106 (a downstream memory bus and an upstream memory bus), connected to the memory controller 110 in either a direct or cascaded manner. The memory module 103 next to the memory controller 110 is connected to the memory controller 110 in a direct manner. The other memory modules 103 are connected to the memory controller 110 in a cascaded manner. Each memory module 103 may include one or more ranks of memory devices 109. At least one of the memory modules 103 depicted in FIG. 1 includes memory devices 109 that have ODTs for a control signal bus. Although not shown in this figure, the memory controller 110 may be integrated in a processor and may connect to more than one memory bus 106.

Figure 2:
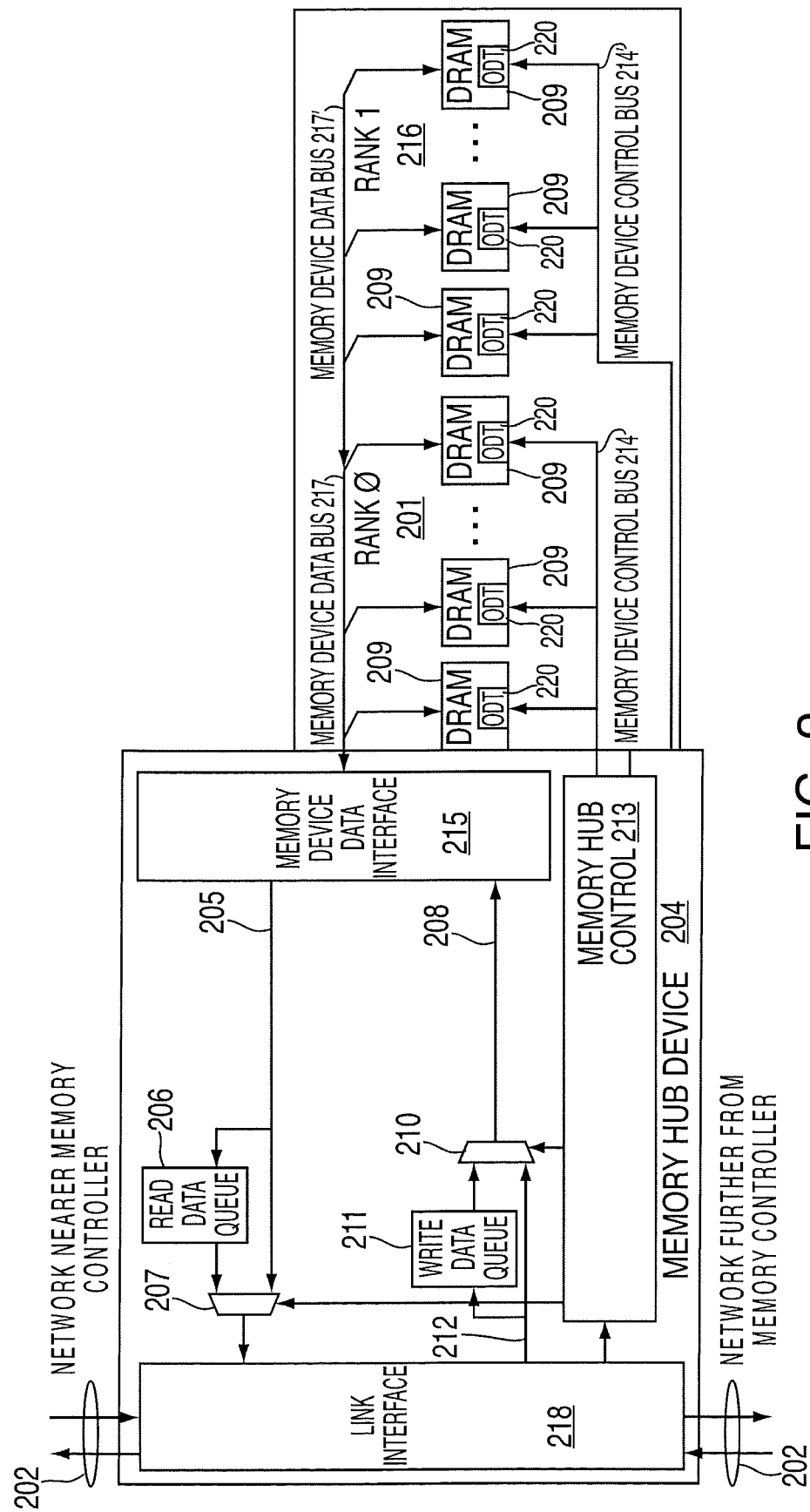
FIG. 2 is a block diagram of a hub device that may be implemented by an exemplary embodiment.

FIG. 2 depicts a block diagram of a memory hub device 204 located on a memory module. The hub device 204 includes a link interface 218 for providing the means to re-synchronize, translate and re-drive high speed memory access information to associated memory devices 209 and/or to re-drive the information downstream on memory bus 202 as applicable based on the memory system protocol. The information is received by the link interface 218 from an upstream memory hub device or from a memory controller (directly or via an upstream memory hub device controller) via the memory bus 202. The memory device data interface 215 manages the technology-specific data interface with the memory devices 209 and controls the bi-directional memory data bus 217. The memory hub control 213 responds to access request packets by responsively driving the memory device 209 technology specific memory device control bus 214 (for memory devices in Rank 0 201) or memory device control bus 614' (for memory devices in Rank 1 216) and directing the read data flow 207 and write data flow 210 selectors. The control busses 214 214' typically carry both address and command information to the memory devices 209. The memory devices 209 depicted in FIG. 2 include ODTs 220 for the control busses 214 214'. The link interface 218 decodes the packets and directs the address and command information directed to the local hub device 204 to the memory hub control 213. Memory write data from the link interface 218 can be temporarily stored in the write data queue 211 or directly driven to the memory devices 209 via the write data flow selector 210 and internal bus 212, and then sent via internal bus 208 and memory device data interface 215 to memory device data bus 217. Memory read data from memory device(s) 209 can be queued in the read data queue 206 or directly transferred to the link interface 218 via internal bus 205 and read data selector 207, to be transmitted on the upstream bus 202 as a read reply packet.

Figure 3:
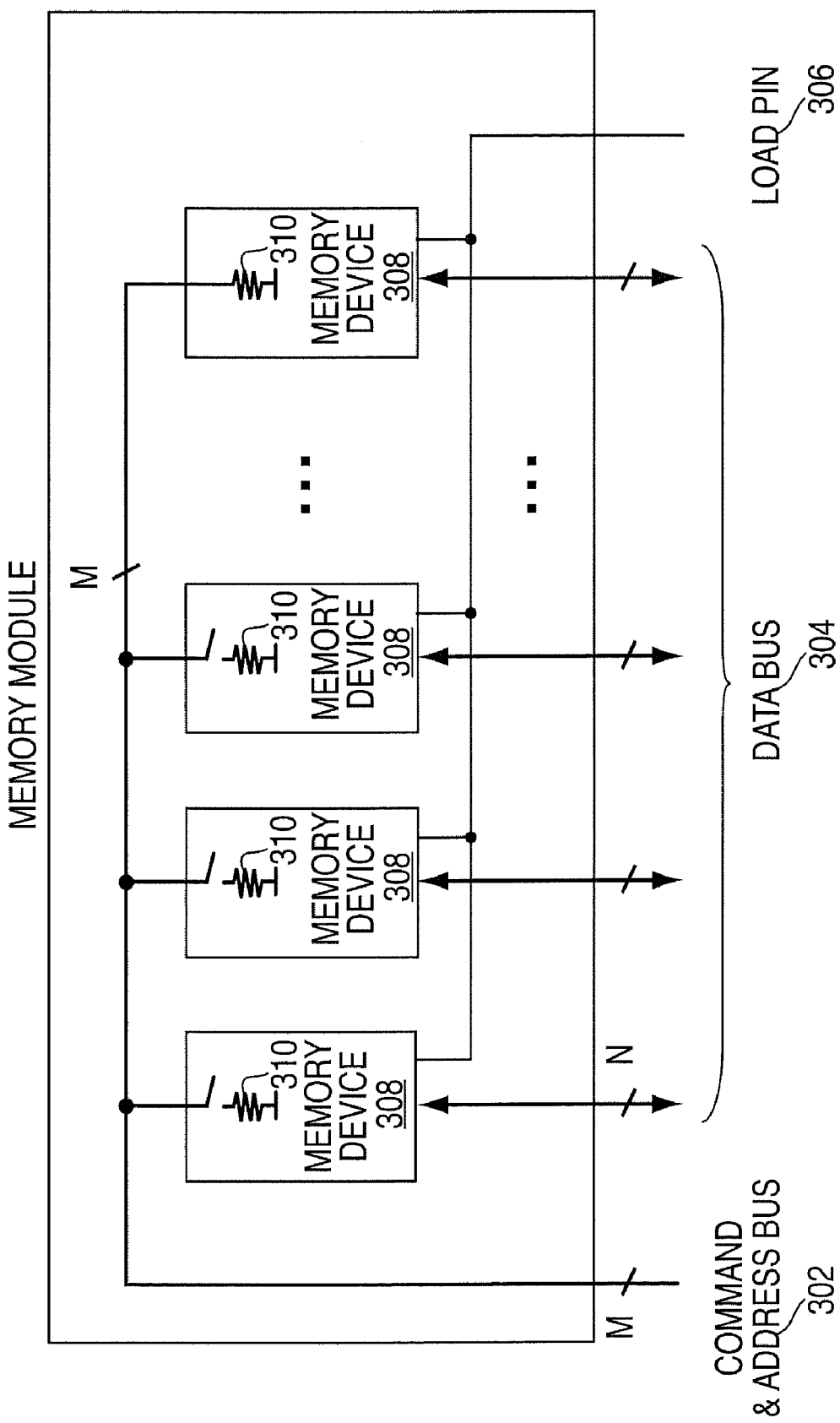
FIG. 3 is a block diagram of a memory module that may be implemented by an exemplary embodiment.

FIG. 3 is a block diagram of a memory module that may be implemented by an exemplary embodiment. The memory module depicted in FIG. 3 includes a load pin 306, a data bus 304, and a control bus 302, and a plurality of memory devices 308 (or memory chips) each having an ODT 310 for the control bus 302. The load pin 306 utilized herein is already located on the memory devices 308/memory module for other purposes. The term "pin" is utilized herein as an example of a connector, other connectors may also be utilized, such as, but not limited to a ball, a column, etc. As depicted in FIG. 3, the three memory devices 308 to the left have their ODT 310 turned off and the memory device 308 to the far right has its ODT 310 turned on. The load pin 306 depicted in FIG. 3 is common to all memory devices 308 on the memory module and is utilized to provide a clock signal to the memory devices 308 to load ODT data into the memory devices 308. In an exemplary embodiment, the data bus 304 carries the ODT data (which may by be different for each memory device 308) into the ODTs 310 located on the memory devices 308.

As described herein below, the ODT data may specify a specific resistance and/or specify whether a particular ODT 310 should be turned on or off. By selectively disabling the termination resistors of an active memory device 308, while leaving the termination resistors of inactive memory devices 308 enabled, it is possible to preserve signal strength on the active memory device 308 while continuing to eliminate signal reflections at the control bus/memory device interface of the inactive memory devices.

Figure 4:
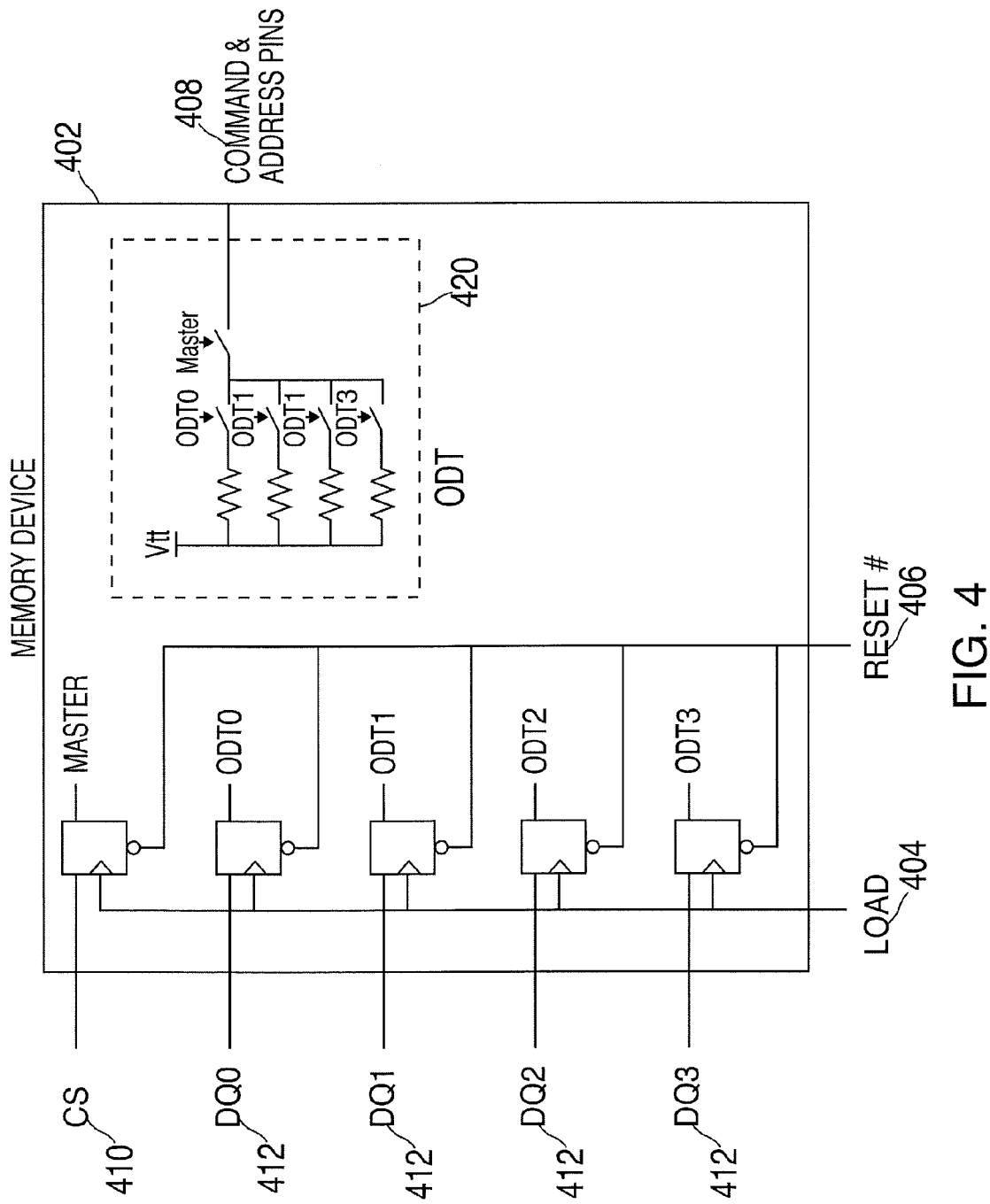
FIG. 4 is a block diagram of a memory device that may be implemented by an exemplary embodiment.

FIG. 4 is a block diagram of a memory device 402 that may be implemented by an exemplary embodiment. The memory device 402 includes a chip select pin 410, a load pin 404, a reset pin 406 and four data pins 412 (DQ0, DQ1, DQ2, and DQ3). In addition, the memory device 402 includes an ODT 420 that includes four resistors corresponding to each of the data pins 412. The ODT 420 is connected to the control bus 408. Further, the ODT 420 includes termination resistors to provide signal termination and exemplary embodiments provide the ability to selectively enable/disable each of the resistors. The size of the resistors is selected based on application requirements (e.g., one hundred ohms, seventy five ohms, etc.) and the resistors in the ODT 420 can all have the same resistance level or be of varying resistance levels.

In response to an ODT command from a memory controller, the values at the data pins 412 are latched at the rising edge of the load pin 404. These values are utilized to enable/disable the corresponding resistors in the ODT 420. In addition, these values may be utilized to change the resistance levels on one or more of the corresponding resistors in the ODT 420. In an alternate embodiment, the ODT 420 includes less resistors than the number of data pins 412 and one or more of the data pins 412 is not utilized to set a resistor in the ODT 420. In another alternate embodiment, the ODT 420 utilizes an extra data pin 412 to specify a resistance level of one or more of the resistors. In a further embodiment, there are more resistors in the ODT 420 than there are data pins 412 and two or more of the resistors are directed by information from the same data pin 412. In a still further embodiment there are more than four or less than four data pins in the memory device 402. The example configurations described herein are intended to be examples and configurations that may be implemented by exemplary embodiments are not limited to those described herein.

Figure 5:
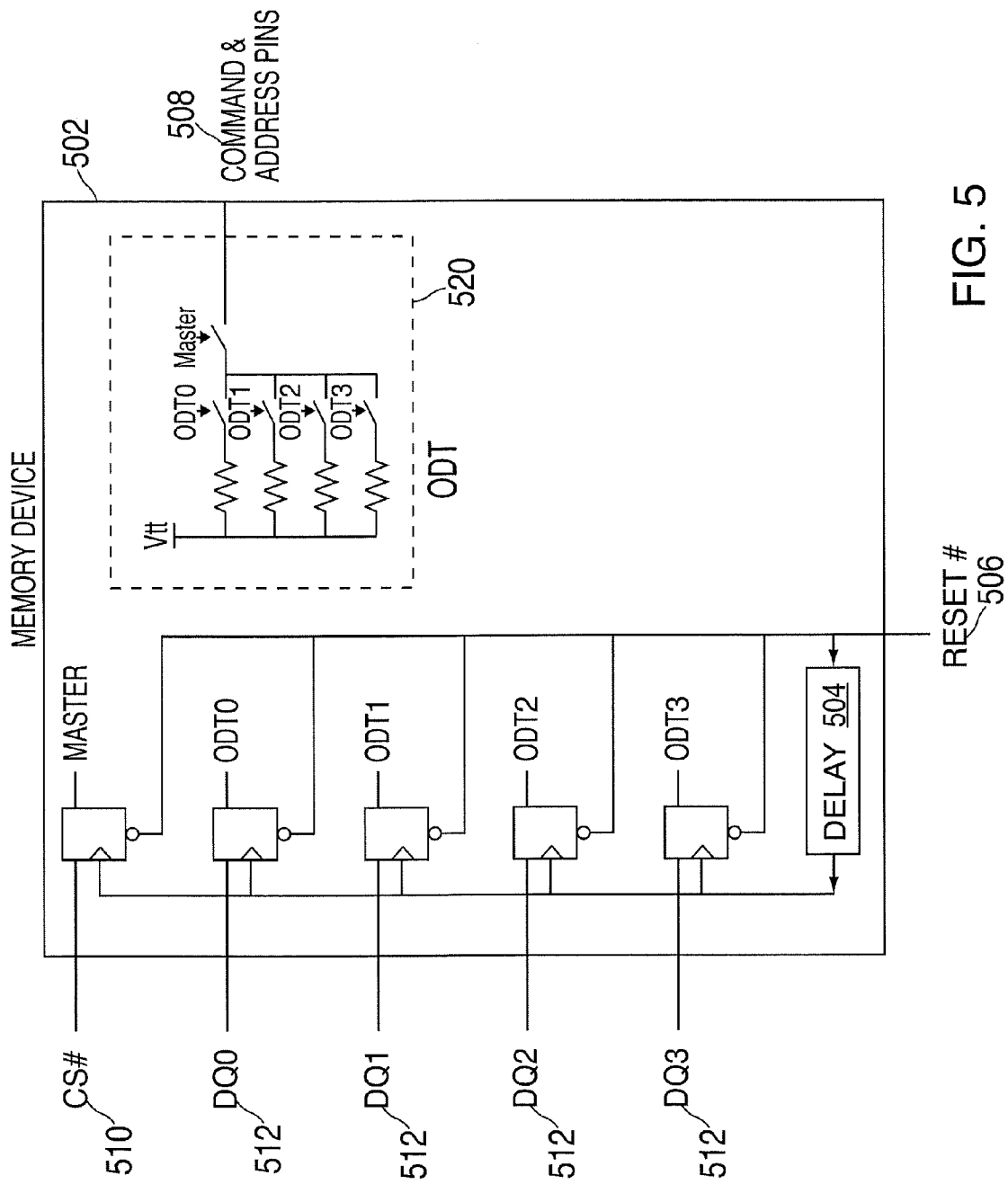
FIG. 5 is a block diagram of a memory device that may be implemented by an exemplary embodiment.

FIG. 5 is a block diagram of a memory device that may be implemented by an exemplary embodiment. The memory device 502 includes a chip select pin 510, a reset pin 506 and four data pins 512 (DQ0, DQ1, DQ2, and DQ3). In addition, the memory device 502 includes an ODT 520 that includes four resistors corresponding to each of the data pins 512. The ODT 520 is connected to the control bus 508. Further, the ODT 520 includes termination resistors to provide signal termination and exemplary embodiments provide the ability to selectively enable/disable each of the resistors. The memory device 502 depicted in FIG. 5 is similar to the memory device 402 depicted in FIG. 4 except that the ODT data is latched using the reset pin 506 and a delay circuit 504 instead of the load pin 404. Thus, the memory device 502 depicted in FIG. 5 does not require a load pin for setting the ODT 520. In an exemplary embodiment, the ODT data is latched at the falling edge of the reset pin 506 plus some amount of delay caused by the delay circuit 504. These values are utilized to enable/disable the corresponding resistors in the ODT 520. In addition, these values may be utilized to change the resistance levels on one or more of the corresponding resistors in the ODT 520. In an exemplary embodiment, the delay circuit 504 is programmable and may be changed during memory system operation.

Figure 6:
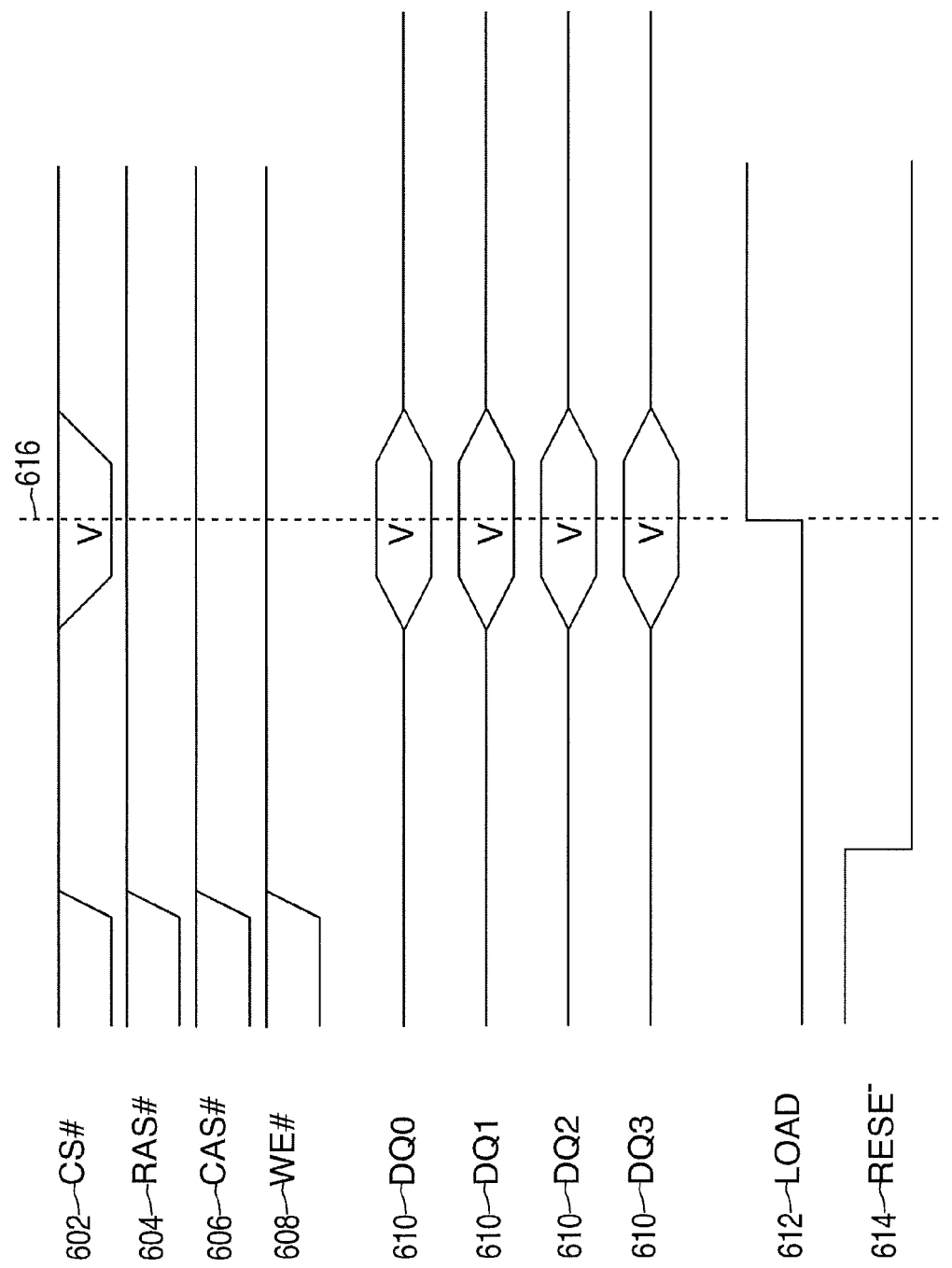
FIG. 6 is a timing diagram for on-die-termination (ODT) that may be implemented by an exemplary embodiment.

FIG. 6 is a timing diagram for ODT that may be implemented by an exemplary embodiment. FIG. 6 includes a chip select signal 602, a row access signal 604, a column access signal 606, a write enable signal, four data signals 610, a load signal 612 and a reset signal 614. As depicted in FIG. 6, ODT data (from the data signals 610) is written when the chip select signal 602, row access signal 604, column access signal 606 and write enable signal 608 are all high. The data is written at point 616 at the rising edge of the load signal 612 or (as described in reference to FIG. 5) a certain amount of delay time after the falling edge of the reset signal 614. By using the chip select signal 602, if there are two or more ranks of memory and the data bus is common to the different memory ranks, then the different ranks may have different ODT settings received via the data bus. This is one example of a timing diagram that may be implemented by an exemplary embodiment of the present invention, other timing diagrams to read in the ODT data may be implemented by alternate exemplary embodiments.

FIG. 7 is a truth table that may be implemented by an exemplary embodiment. It specifies a chip select signal setting (CS#) 702, a fourth data signal setting (DQ3) 704, a third data signal setting (DQ2) 706, a second data signal setting (DQ1) 708, and a first data signal setting (DQ0) 710. In addition, the table specifies a resistance setting for an ODT (RODT) 712 that will result from the various settings when each of the resistors depicted in the ODTs in FIGS. 4 and 5 are two hundred ohms. In all cases, the setting is performed when the CS# 702 is low. When DQ3 704, DQ2 706, DQ1 708 and DQ0 710 are all low, then the all of the resistors in the ODT are disabled and no resistance is provided as indicated by a RODT 712 of "infinite". When DQ3 704, DQ2 706, DQ1 708 are low and DQ0 710 is high, then the all but one of the resistors in the ODT are disabled the resulting resistance is two hundred ohms as indicated in the RODT 712 column. When DQ3 704 and DQ2 706 are low, and DQ1 708 and DQ0 710 are high, then two of the resistors in the ODT are disabled and two of the resistors in the ODT are enabled. This results in a resistance of one hundred ohms as indicated in the $R_{ODT}$ 712 column. In this manner, the ODT may be set to different resistance levels depending on application requirements.

The strength of the resistors is not limited to two hundred ohms as any level of resistance may be provided based on application/configuration requirements. Further, a single ODT may have resistors of different levels, again depending on application/configuration requirements. In addition, the number of data signals utilized by exemplary embodiments is dependent on the number of data pins on the memory device being utilized, and therefore, implementations are not limited to four data signals.

FIG. 8 is a truth table that may be implemented by an exemplary embodiment to program memory devices via a control bus. In an exemplary embodiment, the data bus is latched using the load pin to program memory devices connected to the control bus. The table in FIG. 8 specifies a chip select signal setting (CS#) 802, a fourth data signal setting (DQ3) 804, a third data signal setting (DQ2) 806, a second data signal setting (DQ1) 808, and a first data signal setting (DQ0) 810. In addition, the table specifies a chip identifier 812 that will result from the chip select setting 802 and the various data signal settings. When DQ3 804, DQ2 806, DQ1 708 and DQ0 710 are all low, then memory device "0000" receives the command data on the control bus as indicated by the chip identifier 812. When DQ3 804, DQ2 806, DQ1 808 are low and DQ0 810 is high, then memory device "0001" receives the command data on the control bus as indicated by the chip identifier. In this manner, the chip identifier is assigned to the memory device.

In an exemplary embodiment, hub devices may be connected to the memory controller through a multi-drop or point-to-point bus structure (which may further include a cascade connection to one or more additional hub devices). Memory access requests are transmitted by the memory controller through the bus structure (e.g., the memory bus) to the selected hub(s). In response to receiving the memory access requests, the hub device translates the memory access requests to control the memory devices to store write data from the hub device or to provide read data to the hub device. Read data is encoded into one or more communication packet(s) and transmitted through the memory bus(ses) to the memory controller.

In alternate exemplary embodiments, the memory controller(s) may be integrated together with one or more processor chips and supporting logic, packaged in a discrete chip (commonly called a "northbridge" chip), included in a multi-chip carrier with the one or more processors and/or supporting logic, or packaged in various alternative forms that best match the application/environment. Any of these solutions may or may not employ one or more narrow/high speed links to connect to one or more hub chips and/or memory devices.

The memory modules may be implemented by a variety of technology including a DIMM, a single in-line memory module (SIMM) and/or other memory module or card structures. In general, a DIMM refers to a small circuit board which is comprised primarily of random access memory (RAM) integrated circuits or die on one or both sides with signal and/or power pins on both sides of the board. This can be contrasted to a SIMM which is a small circuit board or substrate composed primarily of RAM integrated circuits or die on one or both sides and single row of pins along one long edge. DIMMs have been constructed with pincounts ranging from 100 pins to over 300 pins. In exemplary embodiments described herein, memory modules may include two or more hub devices.

In exemplary embodiments, the memory bus is constructed using multi-drop connections to hub devices on the memory modules and/or using point-to-point connections. The downstream portion of the controller interface (or memory bus), referred to as the downstream bus, may include command, address, data and other operational, initialization or status information being sent to the hub devices on the memory modules. Each hub device may simply forward the information to the subsequent hub device(s) via bypass circuitry; receive, interpret and re-drive the information if it is determined to be targeting a downstream hub device; re-drive some or all of the information without first interpreting the information to determine the intended recipient; or perform a subset or combination of these options.

The upstream portion of the memory bus, referred to as the upstream bus, returns requested read data and/or error, status or other operational information, and this information may be forwarded to the subsequent hub devices via bypass circuitry; be received, interpreted and re-driven if it is determined to be targeting an upstream hub device and/or memory controller in the processor complex; be re-driven in part or in total without first interpreting the information to determine the intended recipient; or perform a subset or combination of these options.

In alternate exemplary embodiments, the point-to-point bus includes a switch or bypass mechanism which results in the bus information being directed to one of two or more possible hub devices during downstream communication (communication passing from the memory controller to a hub device on a memory module), as well as directing upstream information (communication from a hub device on a memory module to the memory controller), often by way of one or more upstream hub devices. Further embodiments include the use of continuity modules, such as those recognized in the art, which, for example, can be placed between the memory controller and a first populated hub device (i.e., a hub device that is in communication with one or more memory devices), in a cascade interconnect memory system, such that any intermediate hub device positions between the memory controller and the first populated hub device include a means by which information passing between the memory controller and the first populated hub device can be received even if the one or more intermediate hub device position(s) do not include a hub device. The continuity module(s) may be installed in any module position(s), subject to any bus restrictions, including the first position (closest to the main memory controller, the last position (prior to any included termination) or any intermediate position(s). The use of continuity modules may be especially beneficial in a multi-module cascade interconnect bus structure, where an intermediate hub device on a memory module is removed and replaced by a continuity module, such that the system continues to operate after the removal of the intermediate hub device. In more common embodiments, the continuity module(s) would include either interconnect wires to transfer all required signals from the input(s) to the corresponding output(s), or be re-driven through a repeater device. The continuity module(s) might further include a non-volatile storage device (such as an EEPROM), but would not include main memory storage devices.

In exemplary embodiments, the memory system includes one or more hub devices on one or more memory modules connected to the memory controller via a cascade interconnect memory bus, however other memory structures may be implemented such as a point-to-point bus, a multi-drop memory bus or a shared bus. Depending on the signaling methods used, the target operating frequencies, space, power, cost, and other constraints, various alternate bus structures may be considered. A point-to-point bus may provide the optimal performance in systems produced with electrical interconnections, due to the reduced signal degradation that may occur as compared to bus structures having branched signal lines, switch devices, or stubs. However, when used in systems requiring communication with multiple devices or subsystems, this method will often result in significant added component cost and increased system power, and may reduce the potential memory density due to the need for intermediate buffering and/or re-drive.

Although not shown in the Figures, the memory modules or hub devices may also include a separate bus, such as a 'presence detect' bus, an I2C bus and/or an SMBus which is used for one or more purposes including the determination of the hub device an/or memory module attributes (generally after power-up), the reporting of fault or status information to the system, the configuration of the hub device(s) and/or memory subsystem(s) after power-up or during normal operation or other purposes. Depending on the bus characteristics, this bus might also provide a means by which the valid completion of operations could be reported by the hub devices and/or memory module(s) to the memory controller(s), or the identification of failures occurring during the execution of the main memory controller requests.

Performances similar to those obtained from point-to-point bus structures can be obtained by adding switch devices. These and other solutions offer increased memory packaging density at lower power, while retaining many of the characteristics of a point-to-point bus. Multi-drop busses provide an alternate solution, albeit often limited to a lower operating frequency, but at a cost/performance point that may be advantageous for many applications. Optical bus solutions permit significantly increased frequency and bandwidth potential, either in point-to-point or multi-drop applications, but may incur cost and space impacts.

As used herein the term "buffer" or "buffer device" refers to a temporary storage unit (as in a computer), especially one that accepts information at one rate and delivers it another. In exemplary embodiments, a buffer is an electronic device that provides compatibility between two signals (e.g., changing voltage levels or current capability). The term "hub" is sometimes used interchangeably with the term "buffer." A hub is a device containing multiple ports that is connected to several other devices. A port is a portion of an interface that serves a congruent I/O functionality (e.g., a port may be utilized for sending and receiving data, address, and control information over one of the point-to-point links, or busses). A hub may be a central device that connects several systems, subsystems, or networks together. A passive hub may simply forward messages, while an active hub, or repeater, amplifies and refreshes the stream of data which otherwise would deteriorate over a distance. The term hub device, as used herein, refers to a hub chip that includes logic (hardware and/or software) for performing memory functions.

Also as used herein, the term "bus" refers to one of the sets of conductors (e.g., wires, and printed circuit board traces or connections in an integrated circuit) connecting two or more functional units in a computer. The data bus, address bus and control signals, despite their names, constitute a single bus since each are often useless without the others. A bus may include a plurality of signal lines, each signal line having two or more connection points, that form a main transmission path that electrically connects two or more transceivers, transmitters and/or receivers. The term "bus" is contrasted with the term "channel" which is often used to describe the function of a "port" as related to a memory controller in a memory system, and which may include one or more busses or sets of busses. The term "channel" as used herein refers to a port on a memory controller. Note that this term is often used in conjunction with I/O or other peripheral equipment, however the term channel has been adopted by some to describe the interface between a processor or memory controller and one of one or more memory subsystem(s).

Further, as used herein, the term "daisy chain" refers to a bus wiring structure in which, for example, device A is wired to device B, device B is wired to device C, etc. The last device is typically wired to a resistor or terminator. All devices may receive identical signals or, in contrast to a simple bus, each device may modify one or more signals before passing them on. A "cascade" or cascade interconnect' as used herein refers to a succession of stages or units or a collection of interconnected networking devices, typically hubs, in which the hubs operate as a logical repeater, further permitting merging data to be concentrated into the existing data stream. Also as used herein, the term "point-to-point" bus and/or link refers to one or a plurality of signal lines that may each include one or more terminators. In a point-to-point bus and/or link, each signal line has two transceiver connection points, with each transceiver connection point coupled to transmitter circuitry, receiver circuitry or transceiver circuitry. A signal line refers to one or more electrical conductors or optical carriers, generally configured as a single carrier or as two or more carriers, in a twisted, parallel, or concentric arrangement, used to transport at least one logical signal.

Memory devices are generally defined as integrated circuits that are composed primarily of memory (storage) cells, such as DRAMs (Dynamic Random Access Memories), SRAMs (Static Random Access Memories), FeRAMs (Ferro-Electric RAMs), MRAMs (Magnetic Random Access Memories), Flash Memory and other forms of random access and related memories that store information in the form of electrical, optical, magnetic, biological or other means. Dynamic memory device types may include asynchronous memory devices such as FPM DRAMs (Fast Page Mode Dynamic Random Access Memories), EDO (Extended Data Out) DRAMs, BEDO (Burst EDO) DRAMs, SDR (Single Data Rate) Synchronous DRAMs, DDR (Double Data Rate) Synchronous DRAMs or any of the expected follow-on devices such as DDR2, DDR3, DDR4 and related technologies such as Graphics RAMs, Video RAMs, LP RAM (Low Power DRAMs) which are often based on the fundamental functions, features and/or interfaces found on related DRAMs.

Memory devices may be utilized in the form of chips (die) and/or single or multi-chip packages of various types and configurations. In multi-chip packages, the memory devices may be packaged with other device types such as other memory devices, logic chips, analog devices and programmable devices, and may also include passive devices such as resistors, capacitors and inductors. These packages may include an integrated heat sink or other cooling enhancements, which may be further attached to the immediate carrier or another nearby carrier or heat removal system.

Module support devices (such as buffers, hubs, hub logic chips, registers, PLL's, DLL's, non-volatile memory, etc) may be comprised of multiple separate chips and/or components, may be combined as multiple separate chips onto one or more substrates, may be combined onto a single package or even integrated onto a single device-based on technology, power, space, cost and other tradeoffs. In addition, one or more of the various passive devices such as resistors, capacitors may be integrated into the support chip packages, or into the substrate, board or raw card itself, based on technology, power, space, cost and other tradeoffs. These packages may include an integrated heat sink or other cooling enhancements, which may be further attached to the immediate carrier or another nearby carrier or heat removal system.

Memory devices, hubs, buffers, registers, clock devices, passives and other memory support devices and/or components may be attached to the memory subsystem and/or hub device via various methods including soldered interconnects, conductive adhesives, socket structures, pressure contacts and other methods which enable communication between the two or more devices via electrical, optical or alternate means.

The one or more memory modules (or memory subsystems) and/or hub devices may be electrically connected to the memory system, processor complex, computer system or other system environment via one or more methods such as soldered interconnects, connectors, pressure contacts, conductive adhesives, optical interconnects and other communication and power delivery methods. Connector systems may include mating connectors (male/female), conductive contacts and/or pins on one carrier mating with a male or female connector, optical connections, pressure contacts (often in conjunction with a retaining mechanism) and/or one or more of various other communication and power delivery methods. The interconnection(s) may be disposed along one or more edges of the memory assembly and/or placed a distance from an edge of the memory subsystem depending on such application requirements as ease-of-upgrade/repair, available space/volume, heat transfer, component size and shape and other related physical, electrical, optical, visual/physical access, etc. Electrical interconnections on a memory module are often referred to as contacts, or pins, or tabs. Electrical interconnections on a connector are often referred to as contacts or pins.

As used herein, the term memory subsystem refers to, but is not limited to: one or more memory devices; one or more memory devices and associated interface and/or timing/control circuitry; and/or one or more memory devices in conjunction with a memory buffer, hub device, and/or switch. The term memory subsystem may also refer to one or more memory devices, in addition to any associated interface and/or timing/control circuitry and/or a memory buffer, hub device or switch, assembled into a substrate, a card, a module or related assembly, which may also include a connector or similar means of electrically attaching the memory subsystem with other circuitry. The memory modules described herein may also be referred to as memory subsystems because they include one or more memory devices and hub devices Additional functions that may reside local to the memory subsystem and/or hub device include write and/or read buffers, one or more levels of memory cache, local pre-fetch logic, data encryption/decryption, compression/decompression, protocol translation, command prioritization logic, voltage and/or level translation, error detection and/or correction circuitry, data scrubbing, local power management circuitry and/or reporting, operational and/or status registers, initialization circuitry, performance monitoring and/or control, one or more co-processors, search engine(s) and other functions that may have previously resided in other memory subsystems. By placing a function local to the memory subsystem, added performance may be obtained as related to the specific function, often while making use of unused circuits within the subsystem.

Memory subsystem support device(s) may be directly attached to the same substrate or assembly onto which the memory device(s) are attached, or may be mounted to a separate interposer or substrate also produced using one or more of various plastic, silicon, ceramic or other materials which include electrical, optical or other communication paths to functionally interconnect the support device(s) to the memory device(s) and/or to other elements of the memory or computer system.

Information transfers (e.g. packets) along a bus, channel, link or other naming convention applied to an interconnection method may be completed using one or more of many signaling options. These signaling options may include such methods as single-ended, differential, optical or other approaches, with electrical signaling further including such methods as voltage or current signaling using either single or multi-level approaches. Signals may also be modulated using such methods as time or frequency, non-return to zero, phase shift keying, amplitude modulation and others. Voltage levels are expected to continue to decrease, with 1.5V, 1.2V, 1V and lower signal voltages expected consistent with (but often independent of) the reduced power supply voltages required for the operation of the associated integrated circuits themselves.

One or more clocking methods may be utilized within the memory subsystem and the memory system itself, including global clocking, source-synchronous clocking, encoded clocking or combinations of these and other methods. The clock signaling may be identical to that of the signal lines themselves, or may utilize one of the listed or alternate methods that is more conducive to the planned clock frequency(ies), and the number of clocks planned within the various subsystems. A single clock may be associated with all communication to and from the memory, as well as all clocked functions within the memory subsystem, or multiple clocks may be sourced using one or more methods such as those described earlier. When multiple clocks are used, the functions within the memory subsystem may be associated with a clock that is uniquely sourced to the subsystem, or may be based on a clock that is derived from the clock related to the information being transferred to and from the memory subsystem (such as that associated with an encoded clock). Alternately, a unique clock may be used for the information transferred to the memory subsystem, and a separate clock for information sourced from one (or more) of the memory subsystems. The clocks themselves may operate at the same or frequency multiple of the communication or functional frequency, and may be edge-aligned, center-aligned or placed in an alternate timing position relative to the data, command or address information.

Information passing to the memory subsystem(s) will generally be composed of address, command and data, as well as other signals generally associated with requesting or reporting status or error conditions, resetting the memory, completing memory or logic initialization and other functional, configuration or related information. Information passing from the memory subsystem(s) may include any or all of the information passing to the memory subsystem(s), however generally will not include address and command information. This information may be communicated using communication methods that may be consistent with normal memory device interface specifications (generally parallel in nature), the information may be encoded into a 'packet' structure, which may be consistent with future memory interfaces or simply developed to increase communication bandwidth and/or enable the subsystem to operate independently of the memory technology by converting the received information into the format required by the receiving device(s).

Initialization of the memory subsystem may be completed via one or more methods, based on the available interface busses, the desired initialization speed, available space, cost/complexity objectives, subsystem interconnect structures, the use of alternate processors (such as a service processor) which may be used for this and other purposes, etc. In one embodiment, the high speed bus may be used to complete the initialization of the memory subsystem(s), generally by first completing a training process to establish reliable communication, then by interrogation of the attribute or 'presence detect' data associated with the various components and/or characteristics associated with that subsystem, and ultimately by programming the appropriate devices with information associated with the intended operation within that system. In a cascaded system, communication with the first memory subsystem would generally be established, followed by subsequent (downstream) subsystems in the sequence consistent with their position along the cascade interconnect bus.

A second initialization method would include one in which the high speed bus is operated at one frequency during the initialization process, then at a second (and generally higher) frequency during the normal operation. In this embodiment, it may be possible to initiate communication with all of the memory subsystems on the cascade interconnect bus prior to completing the interrogation and/or programming of each subsystem, due to the increased timing margins associated with the lower frequency operation.

A third initialization method might include operation of the cascade interconnect bus at the normal operational frequency(ies), while increasing the number of cycles associated with each address, command and/or data transfer. In one embodiment, a packet containing all or a portion of the address, command and/or data information might be transferred in one clock cycle during normal operation, but the same amount and/or type of information might be transferred over two, three or more cycles during initialization. This initialization process would therefore be using a form of 'slow' commands, rather than 'normal' commands, and this mode might be automatically entered at some point after power-up and/or re-start by each of the subsystems and the memory controller by way of POR (power-on-reset) logic included in each of these subsystems.

A fourth initialization method might utilize a distinct bus, such as a presence detect bus (such as the one defined in U.S. Pat. No. 5,513,135 to Dell et al., of common assignment herewith), an I2C bus (such as defined in published JEDEC standards such as the 168 Pin DIMM family in publication 21-C revision 7R8) and/or the SMBUS, which has been widely utilized and documented in computer systems using such memory modules. This bus might be connected to one or more modules within a memory system in a daisy chain/cascade interconnect, multi-drop or alternate structure, providing an independent means of interrogating memory subsystems, programming each of the one or more memory subsystems to operate within the overall system environment, and adjusting the operational characteristics at other times during the normal system operation based on performance, thermal, configuration or other changes desired or detected in the system environment.

Other methods for initialization can also be used, in conjunction with or independent of those listed. The use of a separate bus, such as described in the fourth embodiment above, also offers the advantage of providing an independent means for both initialization and uses other than initialization, such as described in U.S. Pat. No. 6,381,685 to Dell et al., of common assignment herewith, including changes to the subsystem operational characteristics on-the-fly and for the reporting of and response to operational subsystem information such as utilization, temperature data, failure information or other purposes.

With improvements in lithography, better process controls, the use of materials with lower resistance, increased field sizes and other semiconductor processing improvements, increased device circuit density (often in conjunction with increased die sizes) will help facilitate increased function on integrated devices as well as the integration of functions previously implemented on separate devices. This integration will serve to improve overall performance of the intended function, as well as promote increased storage density, reduced power, reduced space requirements, lower cost and other manufacturer and customer benefits. This integration is a natural evolutionary process, and may result in the need for structural changes to the fundamental building blocks associated with systems.

The integrity of the communication path, the data storage contents and all functional operations associated with each element of a memory system or subsystem can be assured, to a high degree, with the use of one or more fault detection and/or correction methods. Any or all of the various elements may include error detection and/or correction methods such as CRC (Cyclic Redundancy Code), EDC (Error Detection and Correction), parity or other encoding/decoding methods suited for this purpose. Further reliability enhancements may include operation re-try (to overcome intermittent faults such as those associated with the transfer of information), the use of one or more alternate or replacement communication paths to replace failing paths and/or lines, complement-re-complement techniques or alternate methods used in computer, communication and related systems.

The use of bus termination, on busses as simple as point-to-point links or as complex as multi-drop structures, is becoming more common consistent with increased performance demands. A wide variety of termination methods can be identified and/or considered, and include the use of such devices as resistors, capacitors, inductors or any combination thereof, with these devices connected between the signal line and a power supply voltage or ground, a termination voltage or another signal. The termination device(s) may be part of a passive or active termination structure, and may reside in one or more positions along one or more of the signal lines, and/or as part of the transmitter and/or receiving device(s). The terminator may be selected to match the impedance of the transmission line, or selected via an alternate approach to maximize the useable frequency, operating margins and related attributes within the cost, space, power and other constraints.

Technical effects and benefits include providing a programmable ODT for a control bus on a memory device. This saves space on the memory module and allows each memory device to have a programmable level of resistance provided by the control bus ODT. Exemplary embodiments provide flexibility in managing the states and resistance levels of a control signal bus in the memory system.

As described above, the embodiments of the invention may be embodied in the form of computer-implemented processes and apparatuses for practicing those processes. Embodiments of the invention may also be embodied in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

The invention claimed is:

1. A memory device comprising:
    a plurality of data bus connectors;
    one or both of a load signal connector and a reset signal connector;
    a control bus connector;
    an on-die terminator (ODT) in communication with the control bus connector, the ODT providing a level of termination resistance to a control bus connected to the control bus connector; and
    a mechanism to latch data received via the data bus connectors in response to a signal received via one or both of the load signal connector and the reset signal connector, the data utilized to set the level of termination resistance provided by the ODT.

2. The memory device of claim 1 wherein the memory device includes the load signal connector and the data is latched on an edge of the signal received via the load signal connector.

3. The memory device of claim 2 wherein the edge is a rising edge.

4. The memory device of claim 1 wherein the memory device includes the reset signal connector and the data is latched on an edge of the signal received via the reset signal connector plus a programmable delay.

5. The memory device of claim 4 wherein the edge is a falling edge.

6. The memory device of claim 1 wherein the ODT includes one or more resistors for providing the termination resistance.

7. The memory device of claim 6 wherein the data specifies a resistance level for the resistors.

8. The memory device of claim 6 wherein the data specifies whether each of the resistors should be enabled or disabled.

9. A memory module comprising:
    a control bus;
    a data bus;
    one or both of a load signal and a reset signal; and
    a memory device comprising:
        a plurality of data bus connectors in communication with the data bus;
        one or both of a load signal connector in communication with the load signal and a reset signal connector in communication with the reset signal;
        a control bus connector in communication with the control bus;
        an on-die terminator (ODT) in communication with the control bus connector, the ODT providing a level of termination resistance to the control bus; and
        a mechanism to latch data received via the data bus connectors in response to a signal received via one or both of the load signal connector and the reset signal connector, the data utilized to set the level of termination resistance provided by the ODT.

10. The memory module of claim 9 wherein the memory module includes the load signal, the memory device includes the load signal connector and the data is latched on an edge of the signal received via the load signal connector.

11. The memory module of claim 10 wherein the edge is a rising edge.

12. The memory module of claim 9 wherein the memory module includes the reset signal, the memory device includes the reset signal connector and the data is latched on an edge of the signal received via the reset signal connector plus a programmable delay.

13. The memory module of claim 12 wherein the edge is a falling edge.

14. The memory module of claim 9 wherein the ODT includes one or more resistors for providing the termination resistance.

15. The memory module of claim 14 wherein the data specifies a resistance level for the resistors.

16. The memory module of claim 14 wherein the data specifies whether each of the resistors should be enabled or disabled.

* * * * *